United States Patent
Xin et al.

(10) Patent No.: US 12,021,165 B2
(45) Date of Patent: Jun. 25, 2024

(54) PREPARATION PROCESS AND LED APPLICATION OF COPPER NANOCLUSTERS FLUORESCENT NANOFLOWERS WITH HIGH QUANTUM YIELD

(71) Applicant: SHANDONG UNIVERSITY, Jinan (CN)

(72) Inventors: Xia Xin, Jinan (CN); Shujin Zhou, Jinan (CN); Di Sun, Jinan (CN); Shanshan Zhang, Jinan (CN); Ning Feng, Jinan (CN)

(73) Assignee: SHAN DONG UNIVERSITY, Jinan (CN)

( * ) Notice: Subject to any disclaimer, the term of this patent is extended or adjusted under 35 U.S.C. 154(b) by 279 days.

(21) Appl. No.: 17/456,558

(22) Filed: Nov. 24, 2021

(65) Prior Publication Data
US 2022/0293814 A1    Sep. 15, 2022

(51) Int. Cl.
*H01L 33/00*    (2010.01)
*H01L 33/06*    (2010.01)
*H01L 33/50*    (2010.01)

(52) U.S. Cl.
CPC ............ *H01L 33/005* (2013.01); *H01L 33/06* (2013.01); *H01L 33/502* (2013.01)

(58) Field of Classification Search
CPC ............................. H01L 33/06; H01L 33/502
See application file for complete search history.

(56) References Cited

FOREIGN PATENT DOCUMENTS

| CN | 104861962 A | 8/2015 |
|---|---|---|
| CN | 104893715 A | 9/2015 |
| CN | 106867503 A | 6/2017 |
| CN | 111233924 A | 6/2020 |
| CN | 111548368 A | 8/2020 |
| WO | 2018164642 A1 | 9/2018 |

OTHER PUBLICATIONS

Wu et al., "Assembly-Induced Enhancement of Cu Nanoclusters Luminescence with Mechanochromic Property," 2015, J. Am. Chem. Soc. 137, 12906-13. (Year: 2015).*

(Continued)

*Primary Examiner* — Robert A Vetere
(74) *Attorney, Agent, or Firm* — CBM PATENT CONSULTING, LLC (57) ABSTRACT

A preparation process and LED application of copper nanoclusters (Cu NCs) fluorescent nanoflowers with high quantum yield by dissolving $Cu_4I_4$ into dimethyl sulfoxide (DMSO) and then adding glycerol, it self-assembles into Cu NCs s fluorescent nanoflowers. The $Cu_4I_4$ fluorescent nanoflowers prepared by the invention have outstanding optical properties, a quantum yield up to 64.5%, and can be made into a series of different luminous colors and excellent stability LED only with commercial blue phosphor, such as yellow-green, sky blue, white, wherein according to the mass ratio of 4:5 ratio mix can be prepared white light emission LED. Fluorescent Cu NCs can successfully replace traditional light conversion materials and prepare environmentally friendly LEDs.

6 Claims, 9 Drawing Sheets

(56) References Cited

OTHER PUBLICATIONS

Benito et al., "Geometry Flexibility of Copper Iodide Clusters: Variability in Luminescence Thermochromism," 2015, Inorg. Chem. 54, 4483-94. (Year: 2015).*

Zhao Si-Si, et al Stereochemically Dependent Synthesis of Two Cu(I) Cluster-Based Coordination Polymers with Thermochromic Luminescence Inorganic Chemistry, vol. 56, Issue 22; 12379-88 Nov. 3, 2017.

Benito Quentin, et al Geometry Flexibility of Copper Iodide Clusters: Variability in Luminescence Thermochromism Inorganic Chemistry, vol. 54, Issue 9: 4483-94 Apr. 10, 2015.

Huitorel Brendan, Luminescence Mechanochromism of Copper Iodide Clusters: A Rational Investigation Dalton Transactions, vol. 48: 13975-81 Sep. 26, 2017.

* cited by examiner

PREPARATION PROCESS AND LED APPLICATION OF COPPER NANOCLUSTERS FLUORESCENT NANOFLOWERS WITH HIGH QUANTUM YIELD

CROSS REFERENCE

This application claims priority to Chinese Patent Application Ser. No. CN202110275490.6 filed 15 Mar. 2021.

TECHNICAL FIELD

The invention belongs to the field of LED lighting technology, and relates in detail to a preparation method for the copper nanoclusters (Cu NCs) fluorescent nanoflowers with high quantum yield and their application in LED.

BACKGROUND ART

Solid-state lighting in the form of light-emitting diodes (LEDs) has received a lot of interest in recent years due to its excellent properties such as rapid reaction time, high light-emitting efficiency, and wide temperature control range. Metal nanoclusters (NCs) consist of several to hundred of atoms and, due to their extremely small size and unique electronic structure, are potential alternatives to lighting and display applications. Metal NCs have the benefits of ultra-small size, large Stokes shift, and low toxicity over organic dyes and semiconductor quantum dots, and can be employed as light-emitting materials in the production of LEDs. A lot of research has been done on gold and silver NCs, however, compared with the expensive precursor of synthetic gold and silver NCs, the precursor resources for preparing copper nanoclusters (Cu NCs) are relatively abundant, low in price, and easy to obtain from commercial sources, thus Cu NCs are more suitable for various applications. However, compared with the current organic phosphors and semiconductor nanocrystals, Cu NCs have a low emission intensity and quantum yields rarely exceed 0.1%, which greatly limits their application in LEDs. Therefore, it is of great significance and commercial value to find ways to enhance the emission intensity and quantum yield of Cu NCs to promote the application of Cu NCs phosphor in the field of lighting.

Recently, there have been some reports about patents for the preparation of LEDs in Cu NCs. For example: the Chinese patent document CN106590635A (Application Number: CN201611112109.X) has disclosed a yellow or red Cu NCs assembly fluorescent material, preparation method and its application in the preparation of white LED, characterized in that the two-dimensional strip assembly fluorescent material that emits yellow or red light is obtained by using a pot method of colloidal solution, using a high boiling point solvent, aromatic family and adipose carbapenum-based cladding, and by regulating the ligand structure to achieve the regulation of the position of fluorescent emission peak. For example: the China patent document CN107338042A (Application Number: CN201710579460.8) has disclosed a solvent-regulated full-color emission Cu NCs assembly fluorescent material, preparation method and its application in white LED, characterized in that by changing the type of reaction solvent, a stable two-dimensional assembly fluorescent material of a full-color emission made of Cu NCs can be obtained, with a continuous adjustable luminescence color of 490 to 670 nm. However, the above materials have low emission strength, low quantum yield, and more than three kinds of phosphors are needed to fabricate white LED, which increases the preparation cost, makes the preparation process more cumbersome, and reduces the practicality of LED devices.

In addition, the Chinese patent document CN107903891A (Application No. 201711245696.4) has disclosed a preparation method of Cu NCs self-assembly and its application as a fluorescent probe in the detection of histamines. With 2,3,5,6-tetrafluorobenol as ligand and reducing agent, the ribbon-like Cu NCs self-assembly with orange fluorescent is synthesized in one step. However, because the Cu NCs self-assembly is mostly employed in the detecting field, has a quantum yield of 43%, and contains S elements, it does not match the standards for the production of environment-friendly LEDs. The Chinese patent document CN107603604A (Application No. 201710969567.3) has disclosed a Cu NCs fluorescent material and its preparation method with ascorbic acid protection copper nanoparticles as a precursor, a "top-down" strategy to synthesize Cu NCs fluorescent material, ammonia as an etching agent to control the formation of Cu NCs. However, the quantum yield is still low.

In summary, at present, the Cu NCs reports are limited to the exploration of synthesis method and the regulation of emission peak position, as well as the application in the field of detection, for the preparation of high quantum yield Cu NCs fluorescent materials and their application in the field of high-power white LED research is rarely reported. Moreover, the quantum yield of the existing Cu NCs is extremely low, it is difficult to directly apply to the LED field, for white LED materials are mostly modulated using more than three materials and the cost is high.

DESCRIPTION OF THE INVENTION

In view of the shortcomings of the existing technology, the present invention provides the copper nanoclusters (Cu NCs) fluorescent nanoflowers with a high quantum yield and its preparation method and application in white LED. $Cu_4I_4$ used in this invention is quad-core Cu NCs with a ligand of triphenylphosphine. $Cu_4I_4$ has weak luminescence properties due to the $\pi$-$\pi$ interaction between ligands, the charge transfer of ligands to metals, the charge transfer of ligands to metal-metal, and metal-metal interactions, but the quantum yield is close to 0. In this invention, $Cu_4I_4$ are self-assembled into the fluorescent nanoflowers with outstanding optical properties by solvent engineering strategy, with a quantum yield up to 64.5%. The preparation method of Cu NCs fluorescent nanoflowers of this invention is straightforward, using only two types of phosphor to produce ultra-bright white LEDs at a low cost.

BRIEF DESCRIPTION

This invention presents the preparation process and LED application of the copper nanoclusters (Cu NCs) fluorescent nanoflowers with high quantum yield. The Cu NCs fluorescent nanoflowers are obtained by dissolving $Cu_4I_4$ into dimethyl sulfoxide (DMSO) and then adding glycerol. The quantum yield of the prepared Cu NCs fluorescent nanoflowers up to 64.5%, and can successfully replace the traditional light conversion materials, so as to prepare environmental-friendly LEDs.

DETAILED DESCRIPTION

The technical solution of the invention is as follows:

The copper nanoclusters (Cu NCs) fluorescent nanoflowers with high quantum yield are composed of the flakes with a chemical composition of $Cu_4I_4$, which is a quad-core Cu NCs with Cu as the nucleus and triphenylphosphine as the ligand.

According to a preferred embodiment of the invention, the said nanoflowers have a diameter of 30-50 μm, and the flakes that make up the nanoflowers have a length of 15-20 μm and a width of 5-8 μm.

According to a preferred embodiment of the invention, the fluorescent spectra of the said Cu NCs fluorescent nanoflowers show an excitation wavelength of 290-400 nm and a emission wavelength of 450-620 nm.

According to a preferred embodiment of the invention, the quantum yield of the said Cu NCs fluorescent nanoflower is 60-65%.

According to a preferred embodiment of the invention, the said Cu NCs fluorescent nanoflowers have a smooth and orderly structure, maintain a good crystalline state, and have Cu—I, Cu—P and π-π stacking interaction.

According to a preferred embodiment of the invention, the preparation method of the said Cu NCs fluorescent nanoflowers, which comprises steps as follows:

$Cu_4I_4$ self-assembly is induced using DMSO as a good solvent and glycerol as a poor solvent, with the volume of good solvent≤the volume of poor solvent.

According to a preferred embodiment of the invention, the volume ratio of good solvents and poor solvents is 1:(1-3), preferably 1:1.

According to a preferred embodiment of the invention, the process of inducing $Cu_4I_4$ self-assembly is as follows:

The $Cu_4I_4$ are dissolved into DMSO with ultrasound, add glycerol, vortex, static, centrifugal, and dry after washing, resulting in Cu NCs fluorescent nanoflowers powder.

According to a preferred embodiment of the invention, the $Cu_4I_4$ has a molar concentration of $0.12~0.14$ mmol·$L^{-1}$ in DMSO. After adding glycerol and mixing, the final molar concentration of $Cu_4I_4$ is $0.06~0.07$ mmol·$L^{-1}$.

According to a preferred embodiment of the invention, the vortex time is 20~30 s and the incubation time is 5~48 h.

According to a preferred embodiment of the invention, the centrifugal speed is 6000~8000 r/min and the centrifugal time is 10~20 min.

According to a preferred embodiment of the invention, the detergent used for washing is ethanol.

According to a preferred embodiment of the invention, the said $Cu_4I_4$ is prepared according to the following method:

CuI is dispersed in a dichloromethane solution, stir evenly, add triphenylphosphine, then stir at room temperature, filter to obtain white powdered solids. Then, the above white powdered solids are added to the excess acetylene solution, ultrasound, remove the excess CuI, filtration, acetylene washing, to obtain a pure white powdered solid. The pure white solid powder above is dissolved in DMSO solution, added to the diffusion glass tube, the upper layer is diffused by methanol solution, and the $Cu_4I_4$ powder is obtained three days later.

According to a preferred embodiment of the invention, CuI is dispersed in dichloromethane at concentrations of 2-5 mmol·$L^{-1}$, preferably 2.6 mmol·$L^{-1}$; the concentration of triphenylphosphine in the mixed solution is 1-5 mmol·$L^{-1}$, preferably 2.0 mmol·$L^{-1}$.

According to a preferred embodiment of the invention, the ultrasonic frequency is 30~50 kHz, the ultrasonic power is 80 W, and the ultrasonic time is 20~30 min.

According to a preferred embodiment of the invention, the preparation of the said $Cu_4I_4$ including the following steps:

The CuI is dispersed in a dichloromethane solution, stir for 10 min, then add triphenylphosphine, stir at room temperature for 2 hours, filter to obtain a white powdered solid. The above white powdered solids are added to the excess acetylene solution, ultrasound, remove the excess CuI, filtration, acetylene washing, to obtain a pure white powdered solid. The pure white solid powder of 10 mg above is dissolved in a 2 mL DMSO solution, added to the diffusion glass tube, the upper layer is diffused by 2 mL methanol solution, and the $Cu_4I_4$ powder is obtained three days later.

According to the invention, quantum yield is measured using Edinburgh Instruments FLS920, with a light source of xenon lamps, a power of 450 W, and an integral ball test using Barium sulfate powder as a reference.

According to the invention, Cu NCs fluorescent nanoflowers are used in the preparation of LEDs.

According to the invention, an LED comprising the above-mentioned Cu NCs fluorescent nanoflowers is also provided. LED made only by the above-mentioned Cu NCs fluorescent nanoflowers emits yellow-green light.

According to a preferred embodiment of the invention, by mixing the above Cu NCs fluorescent nanoflowers with phosphor of different colors, LEDs in different colors can be obtained.

According to the invention, a white LED comprising the above-mentioned Cu NCs fluorescent nanoflowers is also provided. The Cu NCs fluorescent nanoflowers are mixed with the blue phosphor to fabricate a white LED.

According to a preferred embodiment of the invention, the preparation method of LED for Cu NCs fluorescent nanoflowers is as follows:

The said Cu NCs fluorescent nanoflowers powder is ground evenly, then mixed evenly with phosphor of different colors, and then deposited on the LED chip by glue, curing, to obtain different light-emitting color LED.

According to a preferred embodiment of the invention, the phosphors of different colors are yellow-green or/and blue, and the mass ratio of Cu NCs fluorescent nanoflowers to phosphor of different colors is 1:(0.6-2).

According to a further preferred embodiment of the invention, to make white LED, mix Cu NCs fluorescent nanoflowers and blue phosphor in a ratio of 1:(0.7-0.8), the optimum 4:5 mass ratio.

According to a preferred embodiment of the invention, the glue used for deposition is high-fold LED patch silicone A and B glue and the mass ratio of A and B glue is 1:4.

According to a preferred embodiment of the invention, the excitation wavelength of the LED chip is 365 nm and the light effect is 0.9 lm/W.

According to a preferred embodiment of the invention, the drying temperature of the curing treatment is 60° C. and the curing time is 3 hours.

The principle of the invention are as follows:

The prepared $Cu_4I_4$ in this invention dissolved into DMSO is not fluorescent at room temperature. Through the addition of the poor solvent glycerol, $Cu_4I_4$ gathers, resulting in aggregation induced emission phenomenon. The rotation and vibration of the ligand are well restricted by the solvophobic interaction and π-π stacking effect, and the charge transfer between the ligands and the metal is achieved, resulting in Cu NCs fluorescent nanoflowers with remarkable fluorescence properties. Mixing the strong fluorescent $Cu_4I_4$ nanoflowers powder with commercial blue phosphor in proportion to make LEDs of different emission colors.

The beneficial effects of the invention are as follows:

$Cu_4I_4$ in this invention is a kind of metal NCs with a size less than 2 nm, which belongs to a new inorganic material with novel structure and unique properties. Nanoflowers with ordered structure are formed utilizing the supermolecular self-assembly to achieve fluorescence emission, whereas fluorescent nanoflowers preserve the fluorescence features of solid states.

The prepared $Cu_4I_4$ nanoflowers in this invention can be modulate white light by mixing only with commercial blue phosphor, which reduces the cost and simplifies the preparation process compared with the method of mixing three substances in the past.

The $Cu_4I_4$ fluorescent nanoflower in this invention has strong fluorescence properties, a quantum yield of 64.5%, which can be used as a color conversion layer on a 365 nm LED chip, and a prototype of a high-power ultra-bright white LED (WLED).

The Cu NCs fluorescent nanoflowers in this invention can successfully replace the traditional light conversion material and can make an environmental-friendly LED.

The Cu NCs fluorescent nanoflowers preparation method of the invention is simple and low cost. Furthermore, the light intensity of the prepared LED is excellent and conforms to the requirements of environmental protection.

The material characteristics described in this invention are characterized by the following methods:

Transmission electron microscope (TEM). The structure of fluorescent nanoflowers can be observed through TEM.

Scanning electron microscope (SEM). The surface morphology of fluorescent nanoflowers can be observed by SEM.

Confocal laser scanning microscope (CLSM). The surface morphology and luminous properties of fluorescent nanoflowers can be observed by CLSM.

Optical microscope. The morphology and size of fluorescent nanoflowers can be observed through optical microscopes.

Fluorescence spectrum. The fluorescence intensity of fluorescent nanoflowers can be characterized by a fluorescent spectrometer.

Thermogravimetric analysis (TGA). The TGA shows that the solvent is involved in the self-assembly process.

X-ray diffraction (XRD). The structure of the moleculars inside the nanoflower can be characterized by XRD.

DETAILED EMBODIMENTS

The invention is further described in combination with Embodiments as follows, but is not limited to that.

All raw materials used in the embodiments are conventional raw materials available on the market, including: CuI purchased in Shanghai Zhenxin reagent factory, triphenylphosphine purchased in Adamas Reagents Co., Ltd., DMSO, glycerol, acetylene, methanol purchased in Guopharma Group Chemical Reagents Co., Ltd., blue phosphor purchased in Jinan City Cyber Chemical Reagents Co., Ltd.

Embodiment 1

A preparation method of the Cu NCs fluorescent nanoflowers, including the following steps:

(1) The Synthesis of $Cu_4I_4$

The CuI (500 mg, 2.6 mmol) is dispersed in a dichloromethane solution, stir for 10 min, then add triphenylphosphine (524 mg, 2.0 mmol), stir at room temperature for 2 hours, filter to obtain a white powdered solid. Then, the above white powdered solids are added to the excess acetylene solution, ultrasound, remove the excess CuI, filtration, acetylene washing, to obtain a pure white powdered solid. The 10 mg pure white solid powder is dissolved in 2 mL DMSO, added to the diffusion glass tube, the upper layer is diffused with 2 mL methanol solution, and the $Cu_4I_4$ powder is obtained three days later.

(2) Preparation of Cu NCs Fluorescent Nanoflowers

Add 5 mg $Cu_4I_4$ to 2 mL DMSO, then add 2 mL glycerol and vortex 30 s to mix evenly. The resulting solution is incubated in a thermostat at 20° C. for 6 h. The molar concentration of $Cu_4I_4$ after mixing was 0.065 mmol·$L^{-1}$.

Figure 1:
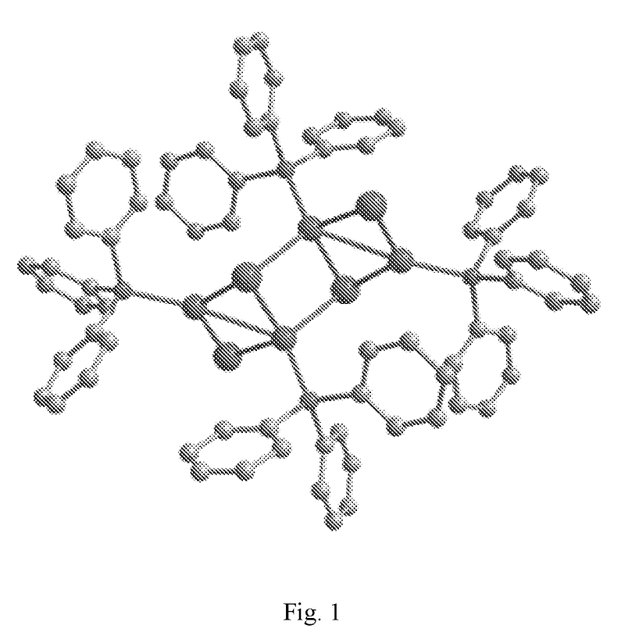
FIG. 1 is a model of the molecular structure of $Cu_4I_4$ synthesized in Embodiment 1.

The molecular structure diagram of $Cu_4I_4$ obtained by this embodiment is shown in FIG. 1. It is known from the FIG. 1 that $Cu_4I_4$ is the Cu NCs of quad-core with Cu as the nucleus and triphenylphosphine as the ligand.

Figure 2A:
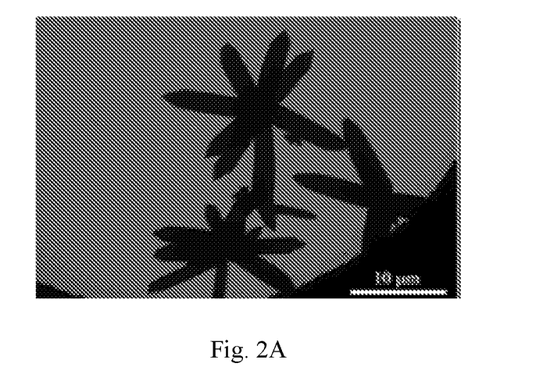
FIG. 2A is microscopic image of Cu NCs fluorescent nanoflowers prepared by Embodiment 1 (TEM image).

The TEM image of the Cu NCs fluorescent nanoflowers obtained by this embodiment is shown in FIG. 2A. As can be seen from FIG. 2A, Cu NCs fluorescent nanoflowers exhibit an orderly and regular structure, which have a diameter of 30-50 μm, the flakes that make up the nanoflowers have a length of 20 μm and a width of 6 μm.

Figure 2B:
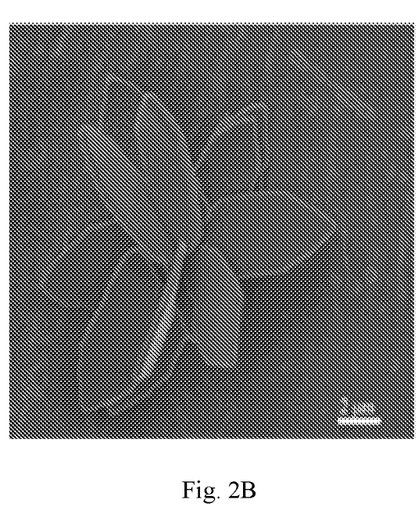
FIG. 2B is microscopic image of Cu NCs fluorescent nanoflowers prepared by Embodiment 1 (SEM image).

The SEM image of the Cu NCs fluorescent nanoflowers obtained in this embodiment is shown in FIG. 2B. As can be seen from FIG. 2B, the surface of the Cu NCs fluorescent nanoflowers is smooth.

Figure 2C:
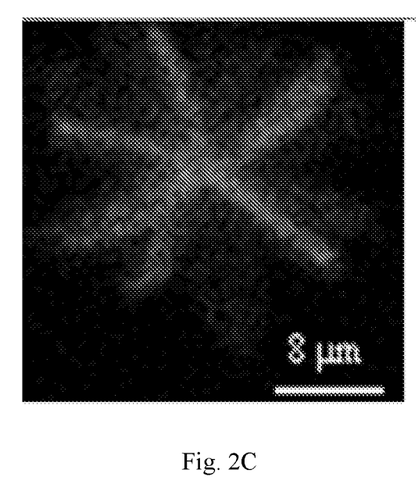
FIG. 2C is microscopic image of Cu NCs fluorescent nanoflowers prepared by Embodiment 1 (CLSM image).

The CLSM image of Cu NCs fluorescent nanoflowers obtained in this embodiment is shown in FIG. 2C.

Figure 2D:
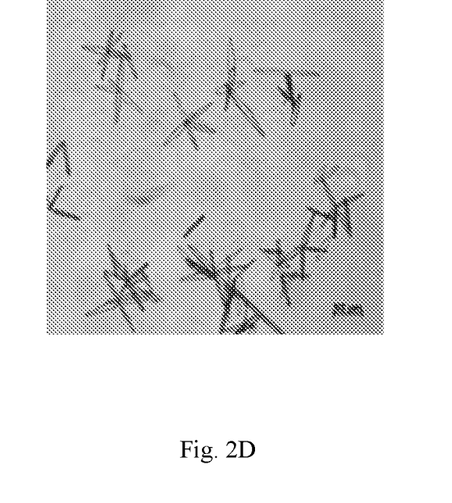
FIG. 2D is microscopic image of Cu NCs fluorescent nanoflowers prepared by Embodiment 1 (optical microscope image).

The optical microscope image of Cu NCs fluorescent nanoflowers obtained in this embodiment is shown in FIG. 2D.

Figure 3:
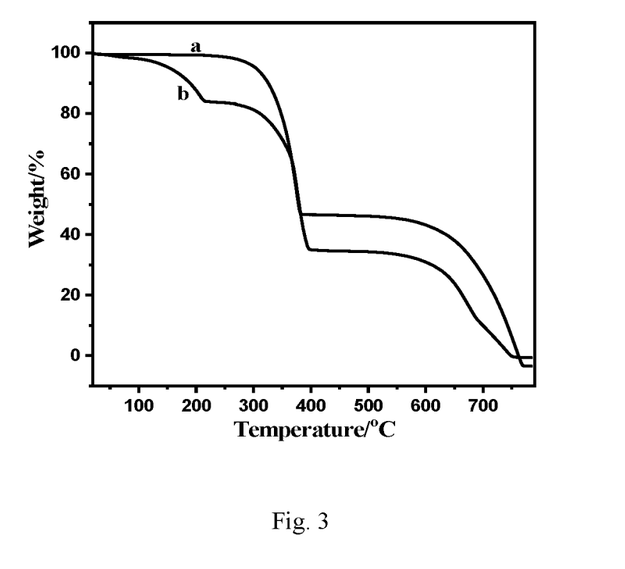
FIG. 3 shows the TGA curve of Cu NCs fluorescent nanoflowers in Embodiment 1, wherein: curve "a" represents $Cu_4I_4$ and curve "b" represents fluorescent nanoflowers.

The TGA curve of Cu NCs fluorescent nanoflowers is shown in FIG. 3, wherein: (a) $Cu_4I_4$ and (b) fluorescent nanoflowers.

Figure 4:
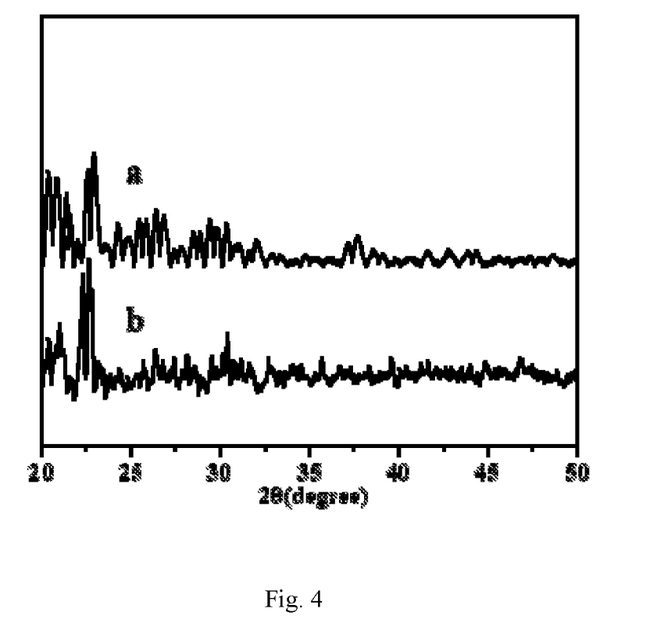
FIG. 4 is the XRD diagram of the Cu NCs fluorescent nanoflowers in Embodiment 1, wherein: curve "a" represents $Cu_4I_4$ and curve "b" represents fluorescent nanoflowers.

The XRD diagram of Cu NCs fluorescent nanoflowers prepared by this embodiment is shown in FIG. 4, wherein: (a) $Cu_4I_4$ and (b) fluorescent nanoflowers. As can be seen from FIG. 4, nanoflowers have an orderly structure, maintain a good crystalline state, and has Cu—I, Cu—P and π-π stacking interaction.

Figure 5:
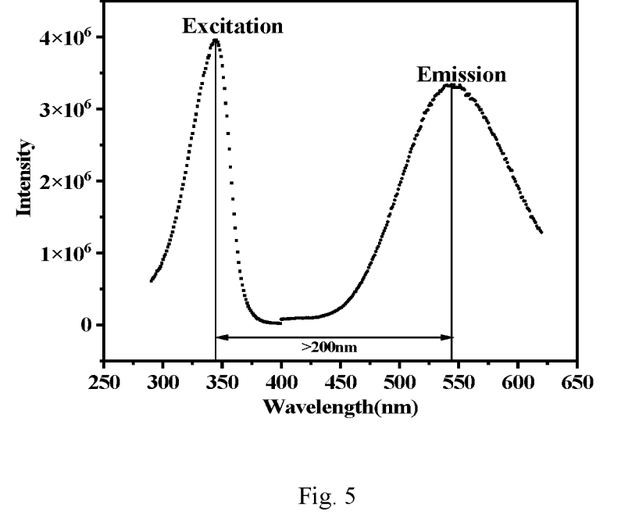
FIG. 5 is the fluorescence spectrum of Cu NCs fluorescent nanoflowers prepared by Embodiment 1.

The fluorescent spectra of the Cu NCs fluorescent nanoflowers prepared by the embodiment are shown in FIG. 5. As can be seen from FIG. 5, the nanoflowers have an ultra-high emission intensity and a wide excitation range, the optimum excitation is 320 nm, the optimum emission is 540 nm, and the Stokes displacement is large (>200 nm).

The quantum yield of Cu NCs fluorescent nanoflowers obtained by this embodiment is tested using Edinburgh Instruments FLS920, the light source is xenon lamp, the power is 450 W, and an integral ball test using Barium sulfate powder as a reference. After testing, the quantum yield of Cu NCs fluorescent nanoflowers obtained in this embodiment is as high as 64.5%.

Embodiment 2

A preparation method for LEDs with yellow-green emission, including the following steps:

The Cu NCs fluorescent nanoflowers produced by Embodiment 1 is centrifugated and dried into powder. Accurately weighing nanoflowers powder 5 mg, fully ground with mortar, and then accurately weigh the high-folding LED patch silicone A and B glue 5 mg and 20 mg respectively, according to the mass ratio of 1:4 mixed evenly, and the sample powder mixed evenly with commercial glue. Take the mixed mucus about the size of the bean grain, deposit it on a commercially available LED chip, and cure the LED in an oven at 60° C. for 3 hours to fabricate the LED.

Figure 6A:
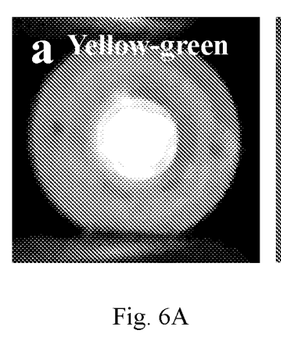
FIG. 6A are photos of LED of different emission colors prepared by Embodiment 2 at 365 nm.

The LED photo of the yellow-green emission obtained by this embodiment is shown in FIG. 6A. Spectral analysis shows that the chromaticity coordinate at excitation wavelengths of 365 nm are (0.36, 0.51).

Embodiment 3

A preparation method for LEDs with blue emission, including the following steps:

Accurately weighing the Cu NCs fluorescent nanoflowers and blue phosphor 5 mg and 20 mg respectively, fully ground with mortar, and then accurately weigh the high-fold LED patch silicone A and B glue 5 mg and 20 mg respectively, mix evenly according to the mass ratio of 1:4, and mix the sample powder with commercial glue. Take the mixed mucus about the size of the bean grain, deposit it on a commercially available LED chip, and cure the LED in an oven at 60° C. for 3 hours to fabricate the LED.

Figure 6B:
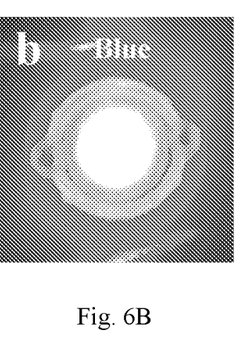
FIG. 6B are photos of LED of different emission colors prepared by Embodiment 3 at 365 nm.

The LED photo of the blue emission obtained by this embodiment is shown in FIG. 6B. Spectral analysis shows that the chromaticity coordinate at excitation wavelengths of 365 nm are (0.23, 0.24).

Embodiment 4

A preparation method for LEDs with white emission, including the following steps:

Accurately weighing the Cu NCs fluorescent nanoflowers and blue phosphor 8 mg and 10 mg respectively, fully ground with mortar, and then accurately weigh the high-fold LED patch silicone A and B glue 5 mg and 20 mg respectively, mix evenly according to the mass ratio of 1:4, and mix the sample powder with commercial glue. Take the mixed mucus about the size of the bean grain, deposit it on a commercially available LED chip, and cure the LED in an oven at 60° C. for 3 hours to fabricate the LED.

Figure 6C:
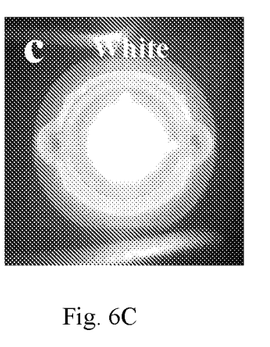
FIG. 6C are photos of LED of different emission colors prepared by Embodiment 4 at 365 nm.
Figure 7A:
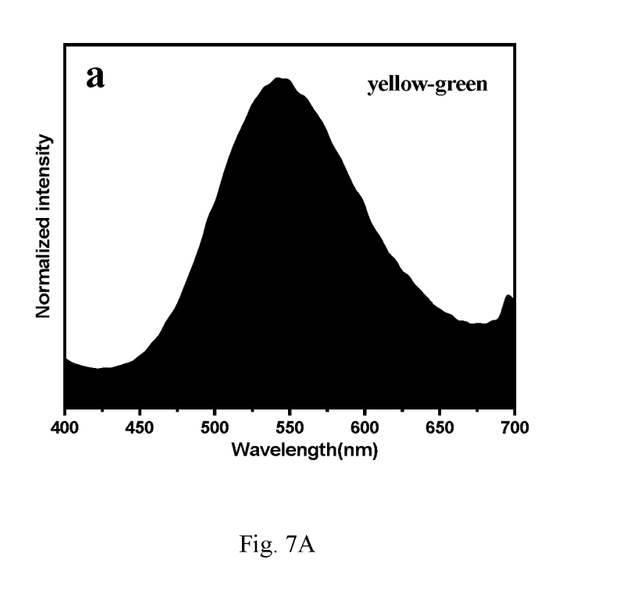
FIG. 7A shows the fluorescence spectrum of LEDs of different emission colors prepared by Embodiment 2.
Figure 7B:
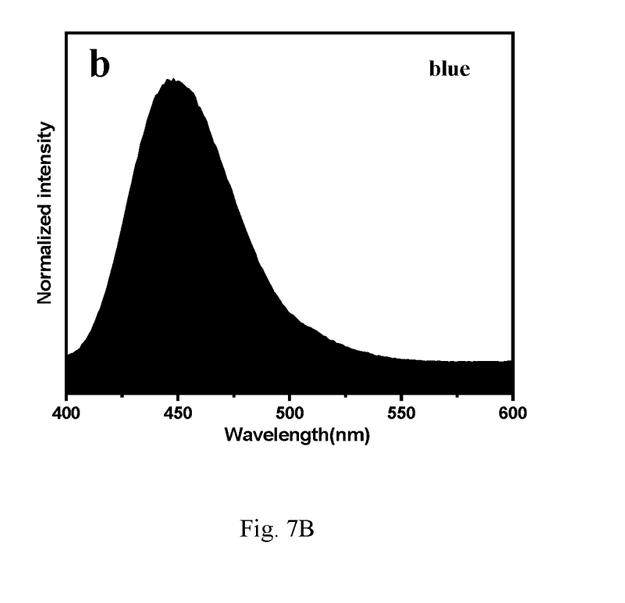
FIG. 7B shows the fluorescence spectrum of LEDs of different emission colors prepared by Embodiment 3.
Figure 7C:
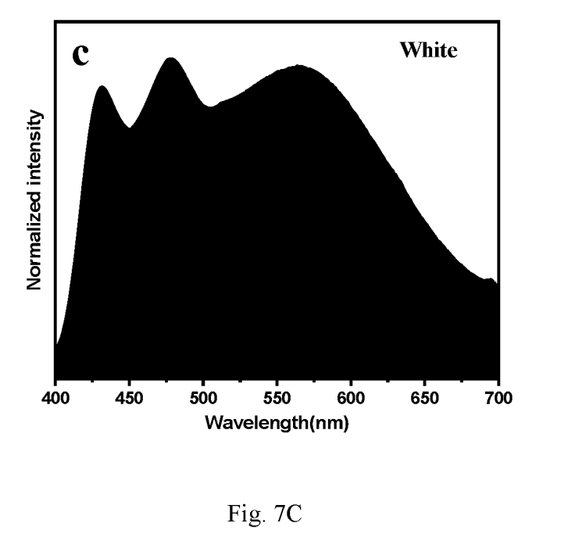
FIG. 7C shows the fluorescence spectrum of LEDs of different emission colors prepared by Embodiment 4.
Figure 8:
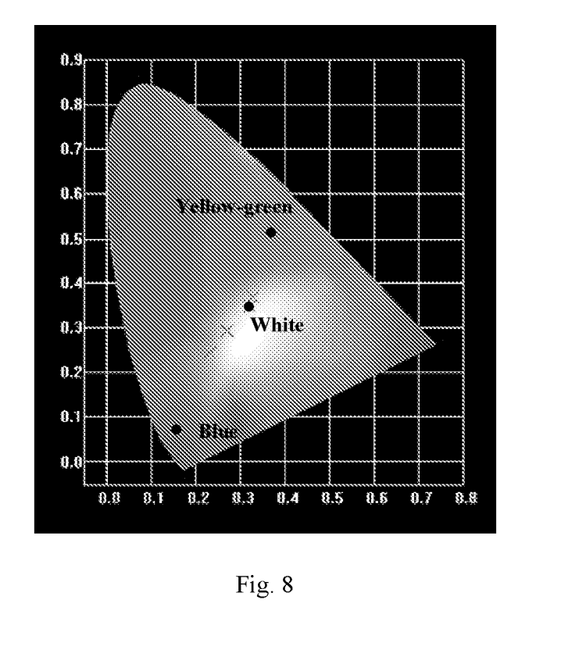
FIG. 8 is the CIE diagram of phosphors of different emission colors.

The LED photo of the blue emission obtained by this embodiment is shown in FIG. 6C. Spectral analysis shows that the chromaticity coordinate at excitation wavelengths of 365 nm are (0.32, 0.34).

Embodiment 5

As described in Embodiment 1, a preparation method for Cu NCs fluorescent nanoflowers, including the following steps:

Add 4.5 mg $Cu_4I_4$ to 2 mL DMSO, then add 2 mL glycerol and vortex 30 s to mix evenly. The resulting solution is incubated in a thermostat at 20° C. for 6 h. The molar concentration of $Cu_4I_4$ after mixing was 0.060 mmol·$L^{-1}$.

The molecular structure diagram of $Cu_4I_4$ obtained by this embodiment is shown in FIG. 1. It is known from the FIG. 1 that $Cu_4I_4$ is the Cu NCs of four cores with Cu as the nucleus and triphenylphosphine as the ligand.

Figure 9A:
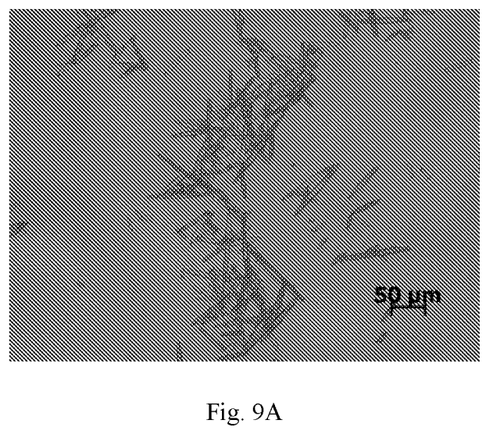
FIG. 9A is optical microscope photos of Cu NCs fluorescent nanoflowers prepared by Embodiment 5.

The optical microscope images of the Cu NCs fluorescent nanoflowers obtained by this embodiment is shown in FIG. 9A. Cu NCs fluorescent nanoflowers exhibit an orderly and regular structure, which have a diameter of 30-50 μm, the flakes that make up the nanoflowers have a length of 20 μm and a width of 6 μm.

Embodiment 6

As described in Embodiment 1, a preparation method for Cu NCs fluorescent nanoflowers, including the following steps:

Add 5.5 mg $Cu_4I_4$ to 2 mL DMSO, then add 2 mL glycerol and vortex 30 s to mix evenly. The resulting solution is incubated in a thermostat at 20° C. for 6 h. The molar concentration of $Cu_4I_4$ after mixing was 0.070 mmol·$L^{-1}$.

The molecular structure diagram of $Cu_4I_4$ obtained by this embodiment is shown in FIG. 1. It is known from the FIG. 1 that $Cu_4I_4$ is the quad-core Cu NCs with Cu as the nucleus and triphenylphosphine as the ligand.

Figure 9B:
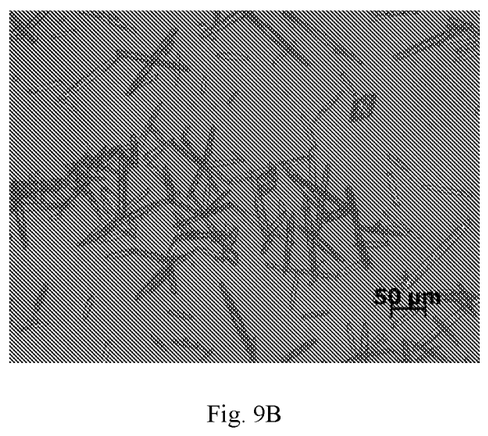
FIG. 9B is optical microscope photos of Cu NCs fluorescent nanoflowers prepared by Embodiment 6.

The optical microscope images of the Cu NCs fluorescent nanoflowers obtained by this embodiment is shown in FIG. 9B. Cu NCs fluorescent nanoflowers exhibit an orderly and regular structure, which have a diameter of 30-50 μm, the flakes that make up the nanoflowers have a length of 20 μm and a width of 6 μm.

Embodiment 7

As described in Embodiment 1, a preparation method for Cu NCs fluorescent nanoflowers, including the following steps:

Add 5 mg $Cu_4I_4$ to 2 mL DMSO, then add 2 mL glycerol and vortex 20 s to mix evenly. The resulting solution is incubated in a thermostat at 20° C. for 6 h. The molar concentration of $Cu_4I_4$ after mixing was 0.070 mmol·$L^{-1}$.

The molecular structure diagram of $Cu_4I_4$ obtained by this embodiment is shown in FIG. 1. It is known from the FIG. 1 that $Cu_4I_4$ is the Cu NCs of four cores with Cu as the nucleus and triphenylphosphine as the ligand.

Figure 9C:
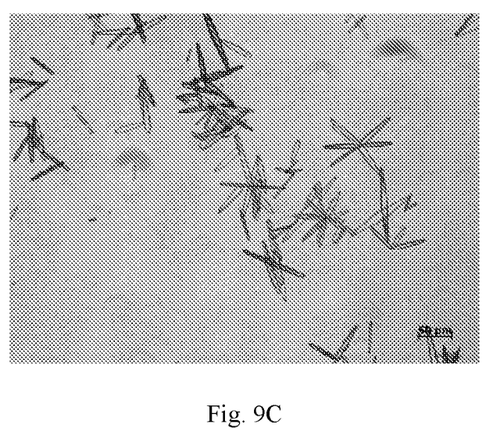
FIG. 9C is optical microscope photos of Cu NCs fluorescent nanoflowers prepared by Embodiment 7.

The optical microscope image of the Cu NCs fluorescent nanoflowers obtained by this embodiment is shown in FIG. 9C. Cu NCs fluorescent nanoflowers exhibit an orderly and regular structure, which have a diameter of 30-50 μm, the flakes that make up the nanoflowers have a length of 20 μm and a width of 6 μm.

Compare Example 1

As described in Embodiment 1, add 5 mg $Cu_4I_4$ to 2.4 mL DMSO, then add 1.6 mL glycerol and vortex 30 s to mix evenly. The resulting solution is incubated in a thermostat at 20° C. for 6 h.

Figure 10A:
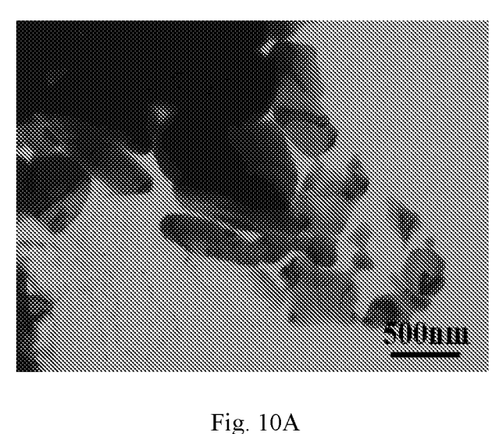
FIG. 10A is a TEM image of the different morphology of Cu NCs fluorescent nanoflowers prepared for Compare Examples 1.

The TEM image of the product obtained by this compare example is shown in FIG. 10A. As seen from FIG. 10A, the product is an irregular structure. Therefore, when the volume ratio of DMSO and glycerol is 6:4, there are no nanoflowers, but an irregular structure.

Compare Example 2

As described in Embodiment 1, add 5 mg $Cu_4I_4$ to 2.8 mL DMSO, then add 1.2 mL glycerol and vortex 30 s to mix evenly. The resulting solution is incubated in a thermostat at 20° C. for 6 h.

Figure 10B:
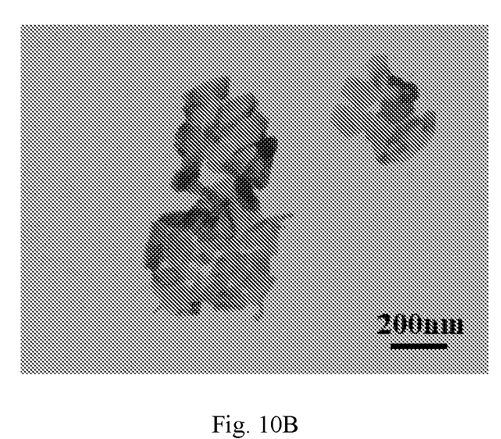
FIG. 10B is a TEM image of the different morphology of Cu NCs fluorescent nanoflowers prepared for Compare Examples 2.

The TEM image of the product obtained by this compare example is shown in FIG. 10B. As seen from FIG. 10B, the product is an irregular structure. Therefore, when the volume ratio of DMSO and glycerol is 7:3, there are no nanoflowers, but an irregular structure.

Compare Example 3

As described in Embodiment 1, add 5 mg $Cu_4I_4$ to 2 mL DMSO, then add 2 mL $H_2O$ and vortex 30 s to mix evenly. The resulting solution is incubated in a thermostat at 20° C. for 6 h.

Figure 10C:
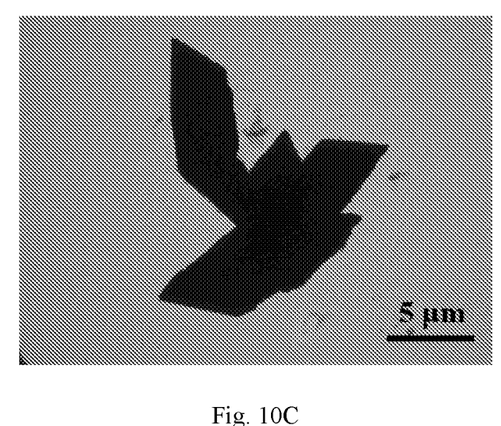
FIG. 10C is a TEM image of the different morphology of Cu NCs fluorescent nanoflowers prepared for Compare Examples 3.

The TEM image of the product obtained by this compare example is shown in FIG. 10C. As seen from FIG. 10C, the product is an irregular structure. Therefore, the water as a poor solvent can not obtain Cu NCs fluorescent nanoflowers, but irregular structure, indicating that not all poor solvents can be successfully obtained Cu NCs nanoflowers.

What is claimed is:

1. A process for preparing LED comprising the following steps: Cu NCs fluorescent nanoflowers are grounded evenly, and mixed with phosphor of different colors, then deposited on a LED chip by gluing and curing that yields various light-emitting color LEDs; wherein the Cu NCs fluorescent nanoflowers comprise flakes with a chemical composition of $Cu_4I_4$, which is quad-core Cu NCs with Cu as nucleus and triphenylphosphine as a ligand; each of the Cu NCs fluorescent nanoflowers has a diameter of 30-50 μm, each of the flakes has a length of 15-20 μm and a width of 5-8 μm.

2. The process according to claim 1, wherein a fluorescent spectra of the Cu NCs fluorescent nanoflowers shows excitation wavelength between 290-400 nm and emission wavelength between 450-620 nm.

3. The process according to claim 1, wherein the Cu NCs fluorescent nanoflowers are prepared by the following steps: $Cu_4I_4$ is dissolved in DMSO with ultrasound, glycerol is added to the dissolved $Cu_4I_4$, vortex is applied to the dissolved $Cu_4I_4$, static is applied to the dissolved $Cu_4I_4$, centrifugal force is applied to the dissolved $Cu_4I_4$, the dissolved $Cu_4L_4$ is washed and then dried; wherein the ratio of the DMSO and glycerol is 1:(1-3) by volume.

4. The process according to claim 3, wherein $Cu_4I_4$ has a molar concentration of 0.06-0.07 mmol·$L^{-1}$ in the dissolved $Cu_4I_4$; vortex is applied to the dissolved $Cu_4I_4$ for 20-30 seconds and the dissolved $Cu_4I_4$ is incubated for 5-48 hours; then, the dissolved $Cu_4I_4$ is centrifuged at 6000-8000 r/min for 10-20 min.

5. The process according to claim 2, wherein the $Cu_4I_4$ is prepared by dispersing CuI in dichloromethane solution, stirring evenly, then adding triphenylphosphine, stirring fully at room temperature, filtering to obtain a white powdered solid; then, adding the white powdered solids to an acetylene solution, performing ultrasound, filtrating, washing with acetylene to obtain a pure white powdered solid; dissolving the pure white solid powder in DMSO solution, adding to a diffusion glass tube, a upper layer is diffused by methanol solution, and yielding $Cu_4I_4$ powders in three days.

6. The process according to claim 1, wherein the Cu NCs fluorescent nanoflowers and blue phosphor are mixed by a mass ratio of 1:(0.7-0.8);
high-fold LED patch silicone A and B glue are utilized for deposition, with a quality ratio of 1:4 for A glue and B glue; the LED chip has an excitation wavelength of 365 nm and a light effect of 0.9 lm/W;
curing at temperature of 60° C. for 3 hours.

* * * * *